United States Patent
Hood et al.

(10) Patent No.: US 8,896,358 B2
(45) Date of Patent: Nov. 25, 2014

(54) PHASE INTERPOLATOR HAVING ADAPTIVELY BIASED PHASE MIXER

(71) Applicant: Avago Technologies General IP (Singapore) Pte. Ltd., Singapore (SG)

(72) Inventors: David A. Hood, Fort Collins, CO (US); Herman H. Pang, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/671,631

(22) Filed: Nov. 8, 2012

(65) Prior Publication Data

US 2014/0125394 A1     May 8, 2014

(51) Int. Cl.
*H03K 5/13* (2014.01)

(52) U.S. Cl.
CPC ....................................... *H03K 5/13* (2013.01)
USPC .......................................... 327/237; 327/231

(58) Field of Classification Search
CPC ................................. H03K 5/13; H03H 11/20
USPC ......................................................... 327/237
See application file for complete search history.

(56) References Cited

U.S. PATENT DOCUMENTS

| | | | |
|---|---|---|---|
| 5,554,945 A * | 9/1996 | Lee et al. ...................... | 327/105 |
| 6,133,773 A | 10/2000 | Garlepp et al. | |
| 6,242,965 B1 * | 6/2001 | Pickering et al. ............. | 327/359 |
| 6,247,138 B1 * | 6/2001 | Tamura et al. ................ | 713/600 |
| 7,535,271 B2 * | 5/2009 | Kizer ............................. | 327/156 |
| 7,902,890 B2 * | 3/2011 | Kizer ............................. | 327/158 |
| 8,120,399 B2 * | 2/2012 | Kizer ............................. | 327/158 |
| 8,184,029 B1 * | 5/2012 | Hsieh et al. ................... | 341/144 |
| 2006/0055430 A1 | 3/2006 | Pickering et al. | |
| 2006/0133558 A1 | 6/2006 | Swartz et al. | |
| 2009/0108898 A1 | 4/2009 | Freyman et al. | |
| 2013/0088274 A1 * | 4/2013 | Gu ................................ | 327/231 |

* cited by examiner

*Primary Examiner* — Ryan Jager

(57) ABSTRACT

A phase interpolator includes an adaptively biased phase mixer, phase control circuitry and an adaptive bias generator. The adaptively biased phase mixer has mixing transistor circuitry configured to provide an output phase signal in response to a plurality of phase control signals, a bias current, and a number of phase input signals offset in phase from one another. The adaptively biased phase mixer further has adjustable bias transistor circuitry configured to adjust the bias current provided to the mixing transistor circuitry in response to an adaptive bias signal.

14 Claims, 8 Drawing Sheets

PHASE INTERPOLATOR HAVING ADAPTIVELY BIASED PHASE MIXER

BACKGROUND

Phase interpolators are circuits that are used in many types of electronic systems, such as, for example, clock-data recovery systems. A phase interpolator receives as inputs a phase selection signal and two or more phase input signals having the same frequency as each other but offset in phase from each other. In response to these inputs, the phase interpolator produces a phase output signal having a phase specified by the phase selection signal. The phase interpolator produces the phase output signal by mixing two of the phase input signals in a ratio derived from the phase selection signal.

As illustrated in FIG. 1, a known phase interpolator 10 includes an adaptive bias generator 12, a triangle wave generator (TWG) 14, a fixed-bias phase mixer 16, phase control logic 18, and a logic level converter 20. Triangle wave generator 14 receives as inputs four phase input (clock) signals, each of which is offset from another by 90 degrees. For example, the four phase input signals can have phases relative to one another of zero degrees (PH0), 90 degrees (PH90), 180 degrees (PH180) and 270 degrees (PH270). Triangle wave generator 14 processes or conditions each of these four phase input signals by buffering the signal, and then using the buffered signal to control the charging and discharging of capacitor circuits (not separately shown). Triangle wave generator 14 includes one such capacitor circuit for each of the four phase input signals. Triangle wave generator 14 limits the current with which each of its four capacitor circuits is charged, such that the capacitor circuit charges for one-half clock cycle and discharges for one-half clock cycle.

As illustrated in FIG. 2, adaptive bias generator 12 in effect functions as a frequency-dependent current source that controls the bias current (I_BIAS_ADAPTIVE) with which triangle wave generator 14 charges each of its capacitors. The purpose of adaptive bias generator 12 is to compensate for (or "adapt" to) variations in mixer operating conditions, such as system clock frequency, supply voltage, etc. Adaptive bias generator 12 includes a comparator 22, a current source 24, two switches 26 and 28, a capacitor 30, and switch control logic 32. Switch control logic 32 controls switches 26 and 28 in response to the system clock. During the first half clock cycle of the system clock, switch control logic 32 closes switch 26 to charge capacitor 30 to a voltage Vsum while maintaining switch 28 open. During the second half clock cycle of the system clock, switch control logic 32 opens switch 26 and closes switch 28 to discharge capacitor 30 to ground. The combination of switches 26 and 28 and capacitor 30 is commonly referred to as a switched-capacitance resistor circuit 34. The feedback loop involving comparator 22 and current source 24 operates to ensure that the bias current (I_BIAS_ADAPTIVE) is sufficient to maintain Vsum equal to a reference voltage (V_REF) and thus to keep the bias current directly proportional to the frequency of the system clock. Thus, adaptive bias generator 12 directly adapts to or compensates for variations in system clock frequency and indirectly adapts to or compensates for voltage and temperature variations. Although not shown for purposes of clarity, current mirrors can be included to replicate the bias current for distribution to all four of the above-referenced capacitor circuits of triangle wave generator 14.

For example, in an instance in which the system clock signal has a frequency that is twice a frequency f, adaptive bias generator 12 generates a bias current that is twice the bias current that it generates when the system clock signal frequency is f. Using adaptive bias generator 12 to control the bias current with which triangle wave generator 14 charges each of its capacitors promotes a linear response to the system clock signal frequency. (Although not shown for purposes of clarity, it should be noted that the four phase input signals are generated from the system clock signal and therefore have the same frequency as the system clock signal.) Accordingly, triangle wave generator 14 generates four corresponding triangle-wave signals in response to the four square-wave phase input signals. The output of triangle wave generator 14 thus consists of four triangle-wave phase output signals having relative phases of zero degrees, 90 degrees, 180 degrees and 270 degrees.

Returning to FIG. 1, phase control logic 18 receives a phase selection signal as an input. The phase selection signal indicates a selected phase in a range greater than or equal to 0 degrees and less than 360 degrees. Phase control logic 18 determines which two of the four phase input signals the selected phase lies between and determines a ratio indicating the relative distances of the selected phase between those two phase input signals. For example, if the phase selection signal indicates a selected phase of 120 degrees, phase control logic 18 determines that the selected phase lies between the 90-degree phase input signal (PH90) and the 180-degree phase input signal (PH180) and determines that the selected phase of 120 degrees lies one-third of the distance (i.e., 90 degrees) from the 90-degree phase input signal to the 180-degree phase input signal, and correspondingly, two-thirds of the distance from the 180-degree phase input signal to the 90-degree phase input signal.

As illustrated in FIG. 3, fixed-bias phase mixer 16 includes a first buffer 36, a second buffer 38, a third buffer 40, and a fourth buffer 42. The input of first buffer 36 receives the 0-degree phase input signal, and the output of first buffer 36 is connected to a common node that serves as the output of fixed-bias phase mixer 16 (PH_OUT). The input of second buffer 38 receives the 90-degree phase input signal, and the output of second buffer 38 is connected to this common node. The input of third buffer 40 receives the 180-degree phase input signal, and the output of third buffer 40 is connected to the common node. The input of fourth buffer 42 receives the 270-degree phase input signal, and the output of fourth buffer 42 is connected to the common node.

First buffer 36 is driven by a bias current provided by a variable current source 44 and a variable current sink 46 that operate in tandem. That is, the source current (IP0) provided by variable current source 44 is equal to the current (IN0) sunk by variable current sink 46. First buffer 36 outputs a current that represents a proportion of the 0-degree phase input signal determined by this bias current (IP0 and IN0). First buffer 36, variable current source 44 and variable current sink 46 collectively define a first buffer circuit 48.

Likewise, second buffer 38 is driven by a bias current provided by a variable current source 50 and a variable current sink 52 that operate in tandem. That is, the source current (IP90) provided by variable current source 50 is equal to the current (IN90) sunk by variable current sink 52. Second buffer 38 outputs a current that represents a proportion of the 90-degree phase input signal determined by this bias current (IP90 and IN90). Second buffer 38, variable current source 50 and variable current sink 52 collectively define a second buffer circuit 54.

Similarly, third buffer 40 is driven by a bias current provided by a variable current source 56 and a variable current sink 58 that operate in tandem. That is, the source current (IP180) provided by variable current source 56 is equal to the current (IN180) sunk by variable current sink 58. Third buffer 40 outputs a current that represents a proportion of the 180-degree phase input signal determined by this bias current (IP180 and IN180). Third buffer 40, variable current source 56 and variable current sink 58 collectively define a third buffer circuit 60.

In the same manner, fourth buffer 42 is driven by a bias current provided by a variable current source 62 and a variable current sink 64 that operate in tandem. That is, the source current (IP270) provided by variable current source 62 is equal to the current (IN270) sunk by variable current sink 64. Fourth buffer 42 outputs a current that represents a proportion of the 270-degree phase input signal determined by this bias current (IP270 and IN270). Fourth buffer 42, variable current source 62 and variable current sink 64 collectively define a fourth buffer circuit 66.

Fixed-bias phase mixer 16 generates an output phase signal (PH_OUT) in accordance with the following equations:

$$IPA=(1-X)*I\_BIAS\_FIXED,$$

$$INA=(1-X)*I\_BIAS\_FIXED,$$

$$IPB=X*I\_BIAS\_FIXED, \text{ and}$$

$$INB=X*I\_BIAS\_FIXED,$$

where IPA and INA represent a first bias current (i.e., a selected one of the following pairs: IP0 and IN0; IP90 and IN90; IP180 and IN180; and IP270 and IN270), where IPB and INB represent a second bias current (i.e., a selected one of the following pairs: IP0 and IN0; IP90 and IN90; IP180 and IN180; and IP270 and IN270), where the selected phase is determined by phase control logic 18 to lie between a phase A and a phase B, where phase A corresponds to the phase input signal that is input to the one of buffers 36-42 driven by IPA and INA (which can be referred to for convenience as "the phase A buffer"), and phase B corresponds to the phase input signal that is input to the one of buffers 36-42 driven by IPB and INB (which can be referred to for convenience as "the phase B buffer"), where X represents the percentage distance between phase A and phase B, and where I_BIAS_FIXED is the sum of the bias current that drives the phase A buffer and the bias current that drives phase B buffer. Note that I_BIAS_FIXED remains fixed, i.e., it does not change in response to any other signal.

In response to the phase selection signal, phase control logic 18 determines phase A and phase B and accordingly determines IPA, INA, IPB and INB. That is, phase control logic 18 sets IPA, INA, IPB and INB by causing the above-described variable current source and sink corresponding to the phase A buffer to be set or adjusted to values of IPA and INA, and causing the above-described variable current sinks corresponding to the phase B buffer to be set or adjusted to values of IPB and INB, respectively. Phase control logic 18 also causes the variable current sources and sinks that do not correspond to the phase A or phase B buffers to be set to a value of zero. With regard to the example described above, in which the phase selection signal indicates a selected phase of 120 degrees and thus in which the selected phase lies between the 90-degree phase input signal (phase A) and the 180-degree phase input signal (phase B), where I_BIAS_FIXED is, for example, 2 mA:

$$IP0=IN0=0,$$

$$IP90=IN90=(1-0.33)*2=1.33 \text{ mA},$$

$$IP180=IN180=0.33*2=0.67 \text{ mA, and}$$

$$IP270=IN270=0.$$

As illustrated in FIG. 4, each of buffer circuits 48, 54, 60 and 66 includes a number (n) of transistor groups, where a digital control word (C0x . . . Cnx) and its complement (NC0x . . . NCnx) received from phase control logic 18 each have n+1 bits. The "x" in the signal name (e.g., Cn"x") identifies one of the four buffer circuits 48, 54, 60 and 66. The transistors can include P-channel and N-channel metal-oxide semiconductor field-effect transistors, commonly abbreviated as "PFET"s and "NFET"s, respectively. The n+1 transistor groups are identical to each other, and each is controlled by a corresponding bit of the control word. A first exemplary transistor group includes a first PFET 68, a second PFET 70, a first NFET 72, and a second NFET 74; corresponding transistors of a second exemplary transistor group, which is identical to the first exemplary transistor group, are labeled 68', 70', 72' and 74'; corresponding transistors of a third exemplary transistor group, which is identical to the first and second exemplary transistor groups, are labeled 68", 70", 72" and 74"; etc., through the nth transistor group, the corresponding transistors of which are labeled 68''', 70''', 72''' and 74'''. Note that PFETs 68, 68', 68", 68''', etc., collectively define an exemplary one of the variable current sources 44, 50, 56 and 62 described above with regard to FIG. 3. Similarly, note that NFETs 74, 74', 74", 74''', etc., collectively define an exemplary one of the variable current sinks 46, 52, 58 and 64 described above with regard to FIG. 3. By adjusting the control word, phase control logic 18 can adjust the bias with which each of buffers 36-42 is driven to correspond to the control word. When buffers 36-42 are driven with bias currents corresponding to the control word, fixed-bias phase mixer 16 produces a triangle wave-format output phase signal (PH_OUT) having a phase corresponding to the phase selection signal. Logic level converter 20 (FIG. 1) converts the triangle wave-format output phase signal (PH_OUT) into a signal having a squarewave format, such as, for example, CMOS logic voltage levels.

SUMMARY

Embodiments of the present invention relate to a phase interpolator that includes an adaptively biased phase mixer, phase control circuitry and an adaptive bias generator. The adaptively biased phase mixer has mixing transistor circuitry configured to provide an output phase signal corresponding to a selected phase in response to a plurality of phase control signals, a bias current, and a plurality of phase input signals offset in phase from one another. The adaptively biased phase mixer further has adjustable bias transistor circuitry configured to adjust the bias current provided to the mixing transistor circuitry in response to an adaptive bias signal. The phase control circuitry is configured to provide the plurality of phase control signals to the adaptively biased phase mixer in response to a phase selection signal corresponding to the selected phase. The adaptive bias generator is configured to generate the adaptive bias signal in response to a frequency of a system clock signal and to provide the adaptive bias signal directly to the bias transistor circuitry of the phase mixer.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 2:
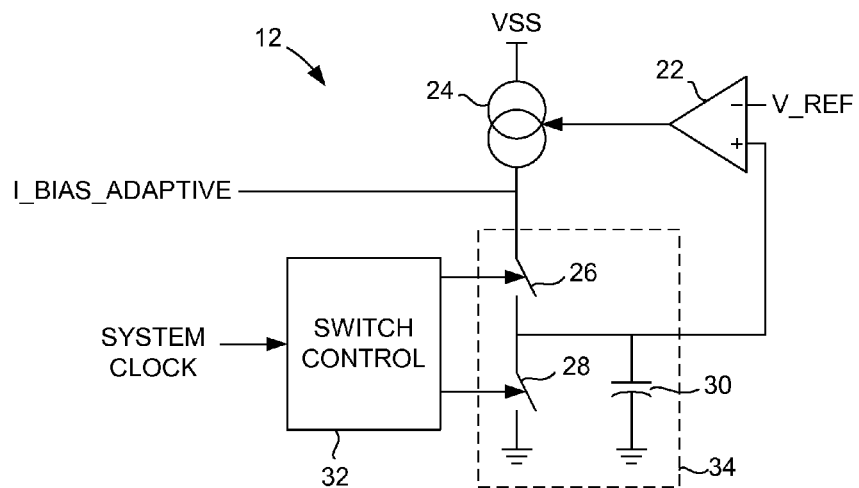
FIG. 2 is a schematic circuit diagram illustrating the adaptive bias generator of the phase interpolator of FIG. 1.
Figure 3:
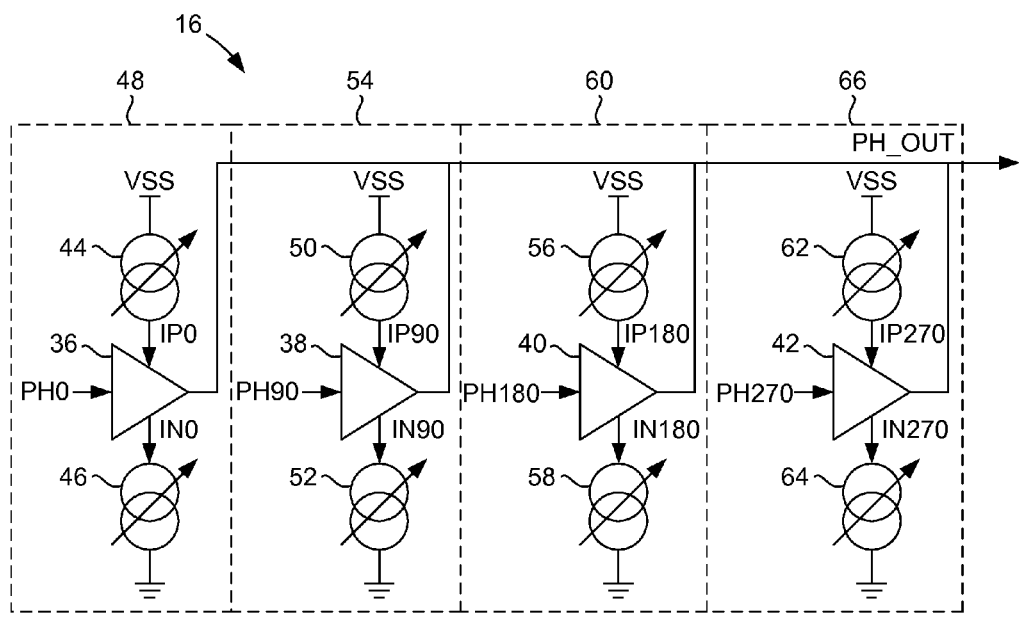
FIG. 3 is a schematic circuit diagram illustrating the fixed-bias phase mixer of the phase interpolator of FIG. 1.
Figure 4:
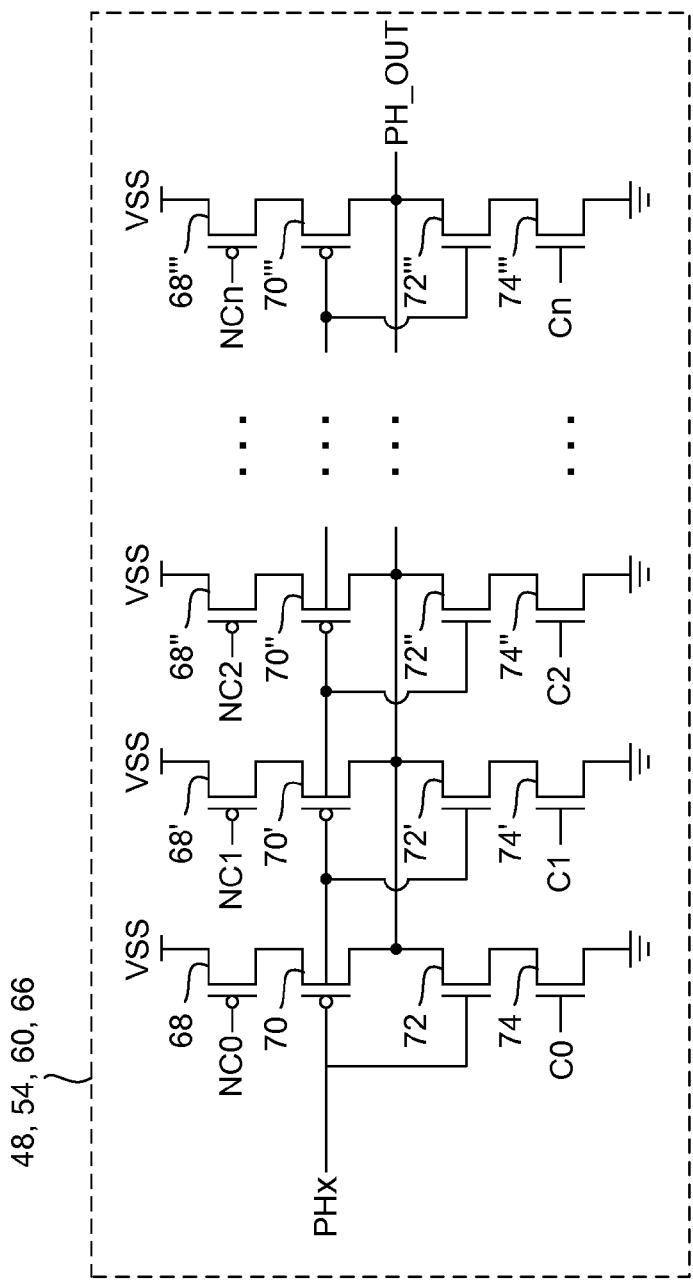
FIG. 4 is a schematic circuit diagram illustrating each of the buffer circuits of the fixed-biased phase mixer of FIG. 3.
Figure 5:
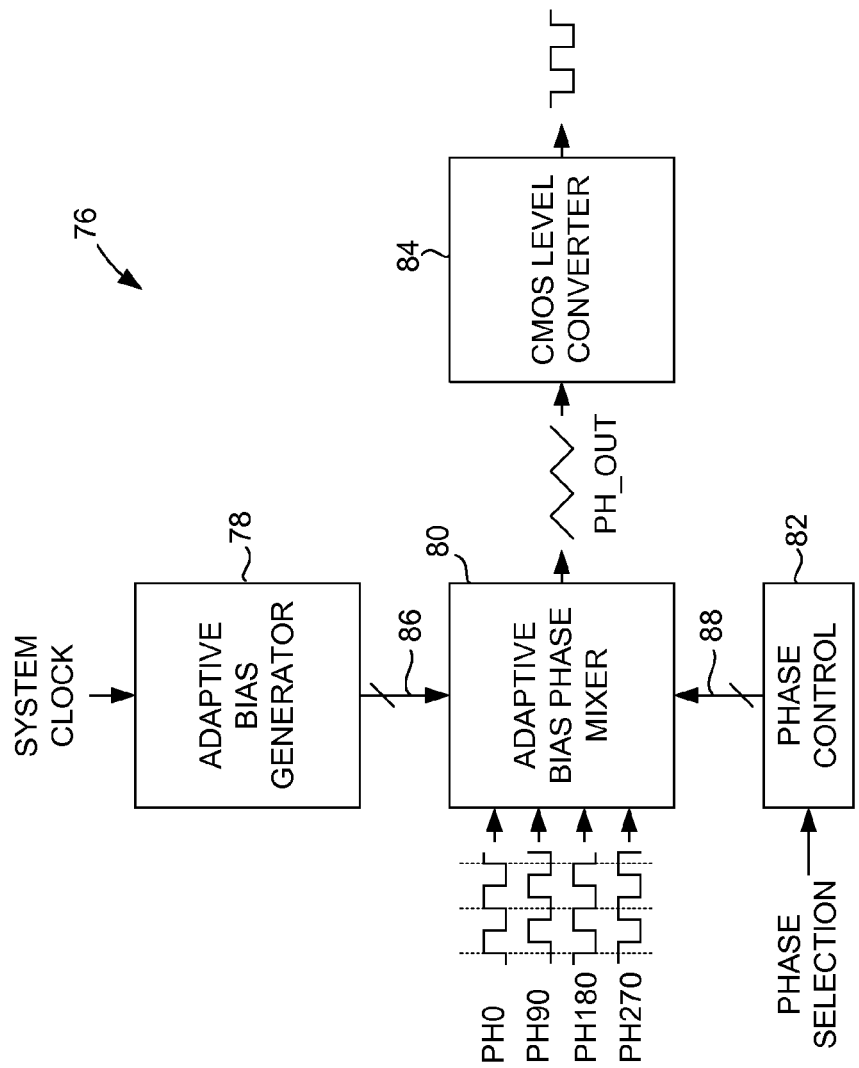
FIG. 5 is a block circuit diagram illustrating a phase interpolator in accordance with an exemplary embodiment of the present invention.

As illustrated in FIG. 5, in accordance with an illustrative or exemplary embodiment of the invention, a phase interpolator 76 includes an adaptive bias generator 78, an adaptively biased phase mixer 80, phase control logic 82, and a logic level converter 84. Adaptive bias generator 78 can be, for example, a conventional type such as that described above with regard to FIG. 2. In response to the system clock frequency, adaptive bias generator 78 produces an adaptive bias signal 86. Adaptive phase mixer 78 receives adaptive bias signal 86 as an input. In the exemplary embodiment, adaptive bias signal 86 is differential, comprising a positive-polarity component or portion (L_BIAS_ADAPTIVE_P) and its complement, i.e., a negative-polarity component or portion (I_BIAS_ADAPTIVE_N). Adaptively biased phase mixer 80 also receives as inputs four phase input (clock) signals, each of which is offset from another by 90 degrees. For example, the four phase input signals can have phases relative to one another of zero degrees (PH0), 90 degrees (PH90), 180 degrees (PH180) and 270 degrees (PH270). Note that the four phase input signals have a squarewave format, as they are derived directly from the system clock and have the same frequency as the system clock. The combination of adaptively biased phase mixer 80 and adaptive bias generator 78 functions as a frequency-dependent phase mixer that adjusts the bias current with which it drives its phase mixing transistors (described below) in response to the system clock frequency.

Phase control logic 82 receives a phase selection signal as an input. The phase selection signal indicates a selected phase in a range greater than or equal to 0 degrees and less than 360 degrees. Phase control logic 82 determines which two of the four phase input signals the selected phase lies between and determines a ratio indicating the relative distances of the selected phase between those two phase input signals. These two phase input signals are referred to herein for convenience as phase input signal A and phase input signal B. Phase control logic 82 outputs four (differential) control words 88 that adaptively biased phase mixer 80 uses to control the ratio with which it mixes the phase input signals A and B. Two of these control words correspond to the mixing ratio of phase input signals A and B and thus control the phase mixing transistors relating to phase input signals A and B. The remaining two of these control words have a zero value that turns the phase mixing transistors relating to the other two phase input signals essentially completely off. The operation of the phase mixing transistors is described below in further detail.

In response to the four phase input signals PH0, PH90, PH180 and PH270, four control words 88, and adaptive bias signal 86, adaptively biased phase mixer 80 produces a substantially triangle wave-format output phase signal (PH_OUT) having a phase corresponding to the phase selection signal. The triangle wave format is due only to parasitic capacitance of the mixing transistor circuitry. Logic level converter 84 converts the triangle wave-format output phase signal (PH_OUT) into a signal having a squarewave format, such as, for example, CMOS logic voltage levels.

Figure 6:
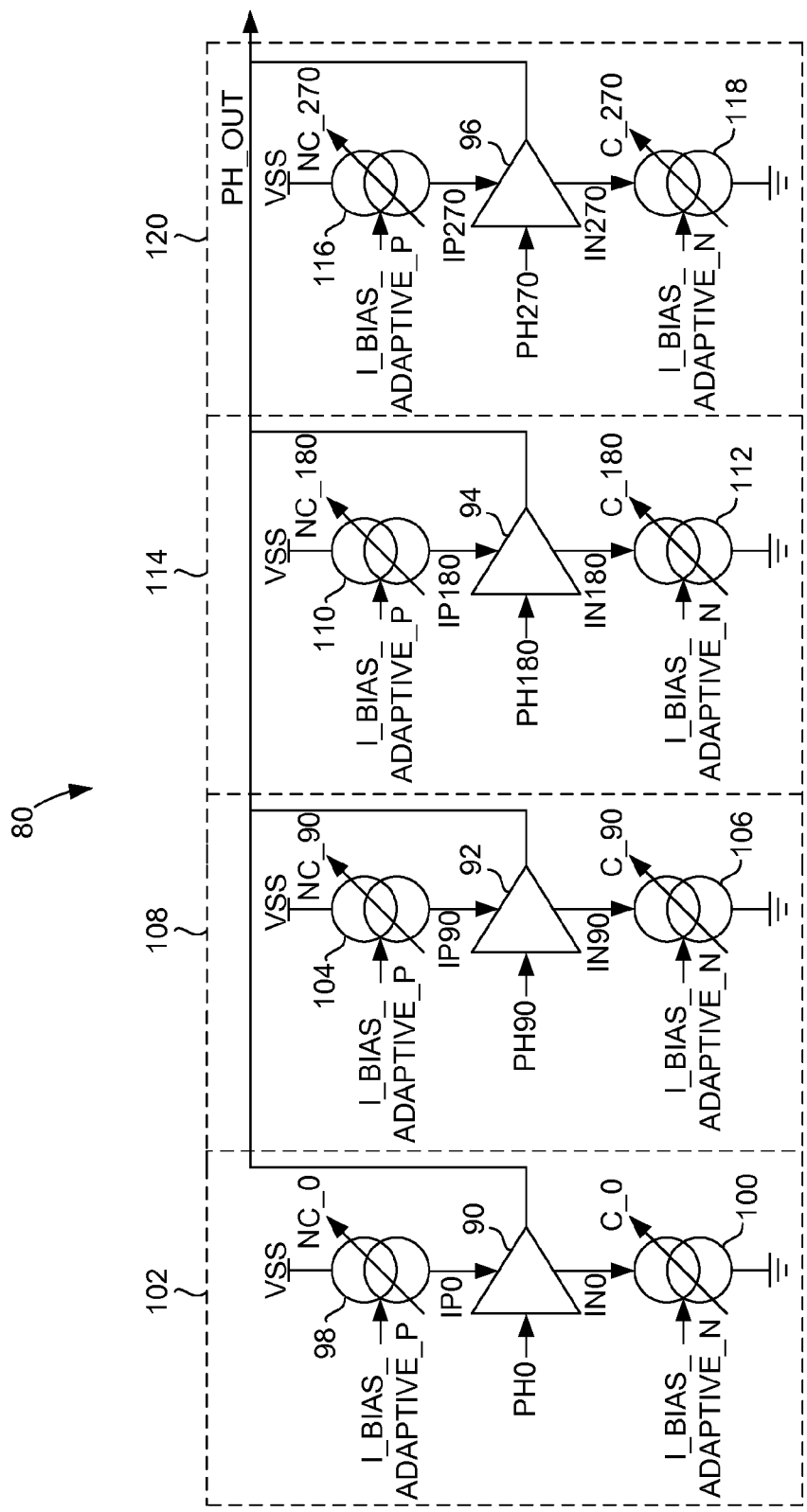
FIG. 6 is a schematic circuit diagram illustrating the adaptively biased phase mixer of the phase interpolator of FIG. 5.

As illustrated in FIG. 6, adaptively biased phase mixer 80 includes a first buffer 90, a second buffer 92, a third buffer 94, and a fourth buffer 96. The input of first buffer 90 receives the 0-degree phase input signal, and the output of first buffer 90 is connected to a common node that serves as the output of adaptively biased phase mixer 80 (PH_OUT). The input of second buffer 92 receives the 90-degree phase input signal, and the output of second buffer 92 is connected to this common node. The input of third buffer 94 receives the 180-degree phase input signal, and the output of third buffer 94 is connected to the common node. The input of fourth buffer 96 receives the 270-degree phase input signal, and the output of fourth buffer 96 is connected to the common node. Although in the exemplary embodiment there are four phase input signals and four corresponding buffers 90-96, in other embodiments there can be any other number of phase input signals and a corresponding number of buffers.

First buffer 90 is driven by a bias current provided by a variable current source 98 and a variable current sink 100 that operate in tandem. That is, the source current (IP0) provided by variable current source 98 is equal to the current (IN0) sunk by variable current sink 100. Variable current source 98 and variable current sink 100 are controlled by, i.e., adjustable in response to, a first one of control words 88 received from phase control logic 82. As this first one of control words 88 is differential, it comprises a positive portion C_0 that controls variable current sink 100 and a negative portion NC_0 (i.e., the complement of C_0) that controls variable current source 98. First buffer 90 outputs a current that represents a proportion of the 0-degree phase input signal determined by this bias current (IP0 and IN0). First buffer 90, variable current source 98 and variable current sink 100 collectively define a first buffer circuit 102. Note that the bias current with which first buffer 90 is driven is determined not only by variable current source 98 and variable current sink 100 but also by adaptive bias signal 86. As adaptive bias signal 86 is differential, it comprises a positive portion I_BIAS_ADAPTIVE_P that determines the amount of current that variable current source 98 can provide, and a negative portion I_BIAS_ADAPTIVE_N (i.e., the complement of I_BIAS_ADAPTIVE_P) that determines the amount of current that variable current sink 100 can sink.

Likewise, second buffer 92 is driven by a bias current provided by a variable current source 104 and a variable current sink 106 that operate in tandem. That is, the source current (IP90) provided by variable current source 104 is equal to the current (IN90) sunk by variable current sink 106. Variable current source 104 and variable current sink 106 are controlled by, i.e., adjustable in response to, a second one of control words 88 received from phase control logic 82. As this second one of control words 88 is differential, it comprises a positive portion C_90 that controls variable current sink 106 and a negative portion NC_90 (i.e., the complement of C_90) that controls variable current source 104. Second buffer 92 outputs a current that represents a proportion of the 90-degree phase input signal determined by this bias current (IP90 and IN90). Second buffer 92, variable current source 104 and variable current sink 106 collectively define a second buffer circuit 108. Note that the bias current with which second buffer 92 is driven is determined not only by variable current source 104 and variable current sink 106 but also by adaptive bias signal 86. The positive portion I_BIAS_ADAPTIVE_P of adaptive bias signal 86 determines the amount of current that variable current source 104 can provide, and the negative portion I_BIAS_ADAPTIVE_N of adaptive bias signal 86 determines the amount of current that variable current sink 106 can sink.

Similarly, third buffer 94 is driven by a bias current provided by a variable current source 110 and a variable current sink 112 that operate in tandem. That is, the source current (IP180) provided by variable current source 110 is equal to the current (IN180) sunk by variable current sink 112. Variable current source 110 and variable current sink 112 are controlled by, i.e., adjustable in response to, a third one of control words 88 received from phase control logic 82. As this third one of control words 88 is differential, it comprises a positive portion C_180 that controls variable current sink 112 and a negative portion NC_180 (i.e., the complement of C_180) that controls variable current source 110. Third buffer 94 outputs a current that represents a proportion of the 180-degree phase input signal determined by this bias current (IP180 and IN180). Third buffer 94, variable current source 110 and variable current sink 112 collectively define a third buffer circuit 114. Note that the bias current with which third buffer 94 is driven is determined not only by variable current source 110 and variable current sink 112 but also by adaptive bias signal 86. The positive portion I_BIAS_ADAPTIVE_P of adaptive bias signal 86 determines the amount of current that variable current source 110 can provide, and the negative portion I_BIAS_ADAPTIVE_N of adaptive bias signal 86 determines the amount of current that variable current sink 112 can sink.

In the same manner, fourth buffer 96 is driven by a bias current provided by a variable current source 116 and a variable current sink 118 that operate in tandem. That is, the source current (IP270) provided by variable current source 116 is equal to the current (IN270) sunk by variable current sink 118. Variable current source 116 and variable current sink 118 are controlled by, i.e., adjustable in response to, a fourth one of control words 88 received from phase control logic 82. As this fourth one of control words 88 is differential, it comprises a positive portion C_270 that controls variable current sink 118 and a negative portion NC_270 (i.e., the complement of C_270) that controls variable current source 116. Fourth buffer 96 outputs a current that represents a proportion of the 270-degree phase input signal determined by this bias current (IP270 and IN270). Fourth buffer 96, variable current source 116 and variable current sink 118 collectively define a third buffer circuit 120. Note that the bias current with which fourth buffer 96 is driven is determined not only by variable current source 116 and variable current sink 118 but also by adaptive bias signal 86. The positive portion I_BIAS_ADAPTIVE_P of adaptive bias signal 86 determines the amount of current that variable current source 116 can provide, and the negative portion I_BIAS_ADAP-TIVE_N of adaptive bias signal 86 determines the amount of current that variable current sink 118 can sink.

Since the variable current source and variable current sink of each of buffer circuits 102, 108, 114 and 120 always operate in tandem, sourcing and sinking the same bias current, the pair of bias currents that drive each of buffers 90, 92, 94 and 96 can be referred to for convenience as though they were a single bias current. For example, IP90 and IN90 can be referred to collectively for convenience as "I90" or as the bias current that drives second buffer 92.

Adaptively biased phase mixer 80 generates an output phase signal (PH_OUT) in accordance with the following equations:

$$IPA=(1-X)*I\_BIAS\_ADAPTIVE\_P,$$

$$INA=(1-X)*I\_BIAS\_ADAPTIVE\_N,$$

$$IPB=X*I\_BIAS\_ADAPTIVE\_P, \text{ and}$$

$$INB=X*I\_BIAS\_ADAPTIVE\_N,$$

where IPA and INA represent a first bias current (i.e., a selected one of the following pairs: IP0 and IN0; IP90 and IN90; IP180 and IN180; and IP270 and IN270), where IPB and INB represent a second bias current (i.e., a selected one of the following pairs: IP0 and IN0; IP90 and IN90; IP180 and IN180; and IP270 and IN270), where the selected phase is determined by phase control logic 82 to lie between a phase A and a phase B, where phase A is the phase of phase input signal A, which is input to the one of buffers 90-96 driven by IPA and INA (which can be referred to for convenience as "the phase A buffer"), and phase B corresponds to the phase of phase input signal B, which is input to the one of buffers 90-96 driven by IPB and INB (which can be referred to for convenience as "the phase B buffer"), where X represents the percentage distance between phase A and phase B. Note that the sum of the bias currents that drive the phase A buffer and phase B buffer can vary or change in response to a change in adaptive bias current 86 (I_BIAS_ADAPTIVE_P and I_BI-AS_ADAPTIVE_N).

Figure 7:
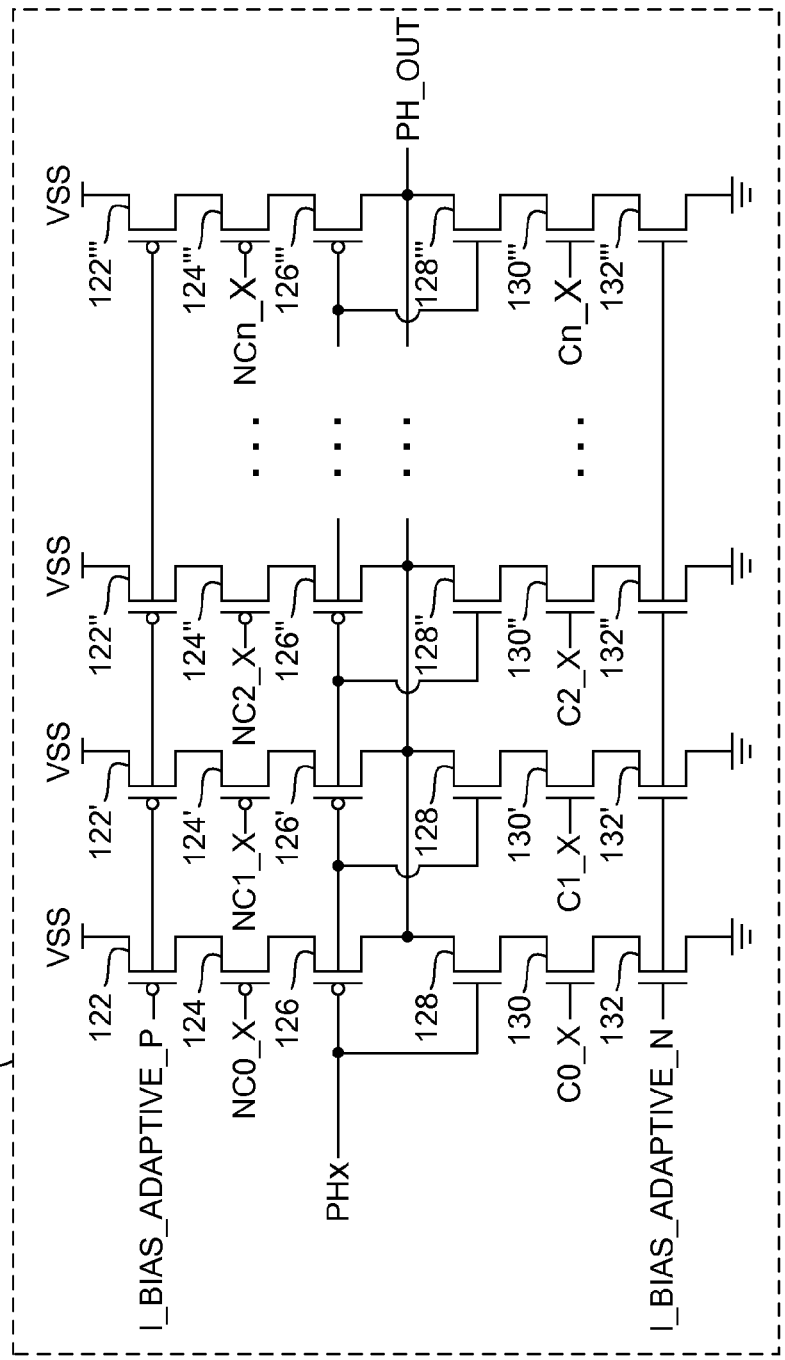
FIG. 7 is a schematic circuit diagram illustrating each of the buffer circuits of the adaptively biased phase mixer of FIG. 6.

As illustrated in FIG. 7, each of buffer circuits 102, 108, 114 and 120 includes a number (n) of transistor groups, where a digital control word (C0_x ... Cn_x) and its complement (NC0_x ... NCn_x) received from phase control logic 82 each have n+1 bits. The "x" in the foregoing signal names (i.e., Cn_"x") identifies one of the four buffer circuits 102, 108, 114 and 120 by the phase of the corresponding one of the phase input signals it receives: "0," "90," "180" and "270" degrees. The transistors can include P-channel and N-channel metal-oxide semiconductor field-effect transistors, commonly abbreviated as "PFET"s and "NFET"s, respectively. The n+1 transistor groups are identical to each other, and each is controlled by a corresponding bit of the control word.

A first exemplary transistor group includes a first PFET 122, a second PFET 124, a third PFET 126, a first NFET 128, a second NFET 130, and a third NFET 132. PFETs and NFETs 122-132 are interconnected in series with each other, i.e., they are interconnected in a chain-like arrangement through their source and drain terminals, between the supply voltage (VSS) and ground potential. The source terminal of first PFET 122 is connected to the supply voltage. The drain terminal of first PFET 122 is connected to the source terminal of second PFET 124. The gate terminal of first PFET 122 is controlled by the positive portion I_BIAS_ADAPTIVE_P of adaptive bias signal 86. The drain terminal of second PFET 124 is connected to the source terminal of third PFET 126. The gate terminal of second PFET 124 is controlled by the negative portion of the first bit NC0_*x* of the one of control words 88 associated with buffer circuit "x," where "x" identifies one of buffer circuits 102, 108, 114 and 120. The drain terminal of third PFET 126 is connected to the drain terminal of first NFET 128. The gate terminal of third PFET 126 and the gate terminal of first NFET 128 receive one of the phase input signals (PH_x). The source terminal of first NFET 128 is connected to the drain terminal of second NFET 130. The source terminal of second NFET 130 is connected to the drain terminal of third NFET 132. The gate terminal of second NFET 130 is controlled by the positive portion of the first bit C0_*x* of the one of control words 88 associated with buffer circuit "x." The source terminal of third NFET 132 is connected to ground potential. The gate terminal of third NFET 132 is controlled by the negative portion I_BIAS_ADAPTIVE_N of adaptive bias signal 86. The drain terminals of third PFET 126 and first NFET 128 provide the output phase signal (PH_OUT).

A second exemplary transistor group, which is identical to the above-described first exemplary transistor group, includes a first PFET 122', a second PFET 124', a third PFET 126', a first NFET 128', a second NFET 130', and a third NFET 132', all of which are connected in the same "in series" manner described above with regard to the corresponding transistors of the first exemplary transistor group. Note, however, that the gate terminal of second PFET 124' is controlled by the negative portion of the second bit NC1_*x* of the one of control words 88 associated with buffer circuit "x." Similarly, the gate terminal of second PFET 130' is controlled by the positive portion of the second bit C1_*x* of the one of control words 88 associated with buffer circuit "x."

A third exemplary transistor group, which is identical to the above-described first and second exemplary transistor groups, includes a first PFET 122", a second PFET 124", a third PFET 126", a first NFET 128", a second NFET 130", and a third NFET 132", all of which are connected in the same "in series" manner described above with regard to the corresponding transistors of the first and second exemplary transistor groups. Note, however, that the gate terminal of second PFET 124" is controlled by the negative portion of the third bit NC2_*x* of the one of control words 88 associated with buffer circuit "x." Similarly, the gate terminal of second PFET 130" is controlled by the positive portion of the second bit C2_*x* of the one of control words 88 associated with buffer circuit "x."

Fourth, fifth, etc., through (n−1) transistor groups (the omission of which is indicated by ellipses (" . . . ")) are not shown for purposes of clarity but are also identical to the above-described first, second and third exemplary transistor groups. The last or nth exemplary transistor group, which is identical to the other transistor groups, includes a first PFET 122''', a second PFET 124''', a third PFET 126''', a first NFET 128''', a second NFET 130''', and a third NFET 132''', all of which are connected in the same manner described above with regard to the corresponding transistors of the other exemplary transistor groups. Note, however, that the gate terminal of nth PFET 124''' is controlled by the negative portion of the nth bit NCn_x of the one of control words 88 associated with buffer circuit "x." Similarly, the gate terminal of second PFET 130''' is controlled by the positive portion of the nth bit Cn_x of the one of control words 88 associated with buffer circuit "x." There can be any number (n) of transistor groups, such as, for example, 32. It can also be noted that the n transistor groups are arranged in parallel with each other, with each transistor group connected between the supply voltage (VSS) and ground potential.

Figure 1:
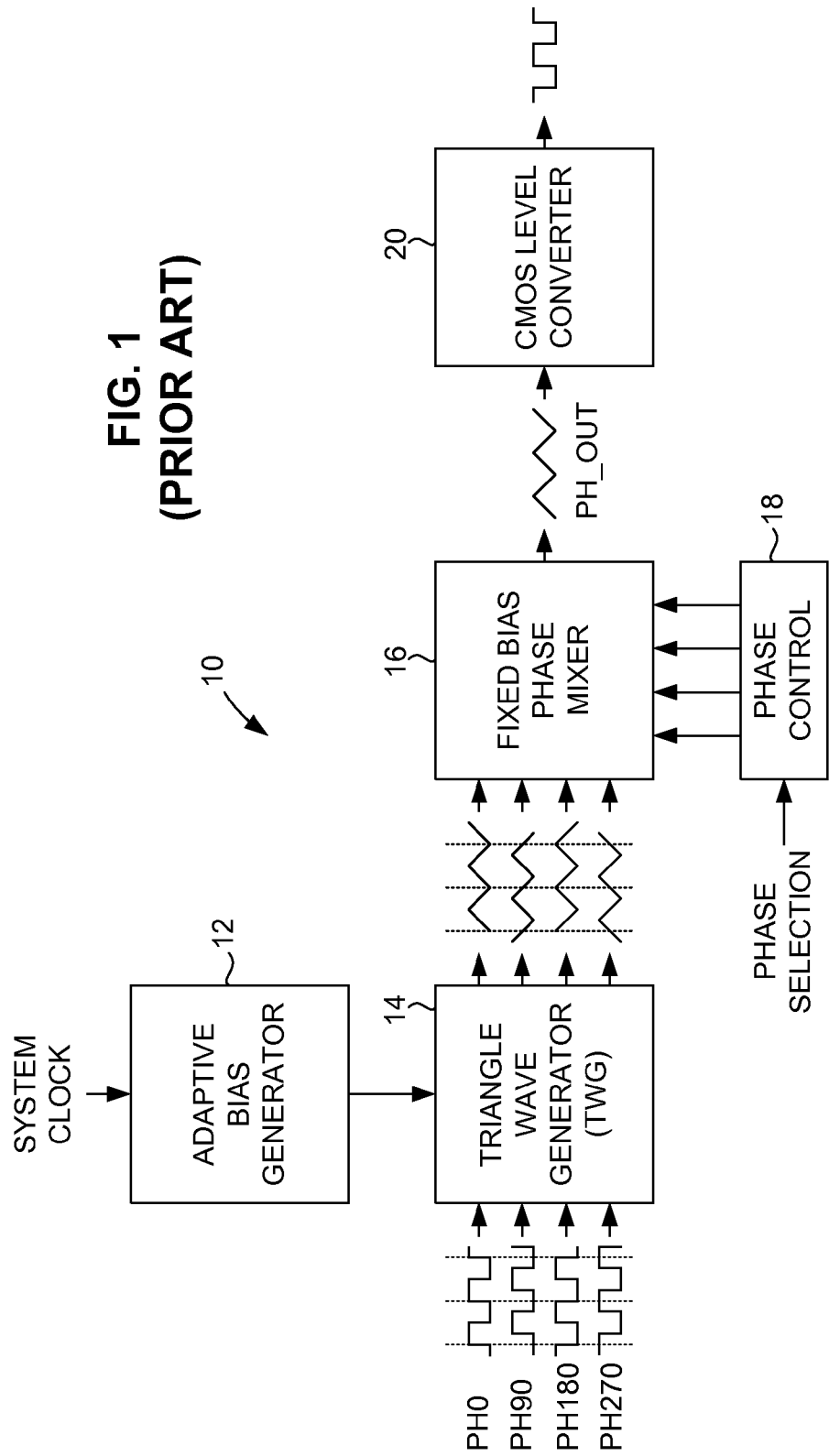
FIG. 1 is a block circuit diagram illustrating a phase interpolator in accordance with the prior art.

Note that PFETs 124, 124', 124", 124''', etc., collectively define an exemplary one of variable current sources 98, 104, 110 and 116 described above with regard to FIG. 6. Similarly, note that NFETs 130, 130', 130", 130''', etc., collectively define an exemplary one of the variable current sinks 100, 106, 112 and 118 described above with regard to FIG. 6. By adjusting the control word, phase control logic 82 can adjust the bias with which each of buffers 90-96 is driven to correspond to the control word. When buffers 90-96 are driven with bias currents corresponding to the control word, adaptively biased phase mixer 82 produces a triangle wave-format output phase signal (PH_OUT) having a phase corresponding to the phase selection signal. Note that these bias currents can change or adjust in response to a change in adaptive bias signal 86 representing a change in the system clock frequency. Like the control words, adaptive bias signal 86 has a digital word format, with the $0^{th}$ through nth bit of its negative portion respectively controlling the gate terminals of PFETs 122, 122', 122", 122''', etc., and the $0^{th}$ through nth bit of its positive portion respectively controlling the gate terminals of NFETs 132, 132', 132", 132''', etc. In the above-described exemplary embodiment, the adaptively generated bias currents are directly proportional to the system clock frequency. Providing this frequency adaptation within the mixing transistor circuitry of adaptively biased phase mixer 80 provides a more nearly linear response than the conventional method (FIG. 1) of providing frequency adaptation in the capacitor-based triangle wave generator 14 that, in turn, provides (frequency adapted) phase input signals to a fixed-bias phase mixer 16.

Figure 8:
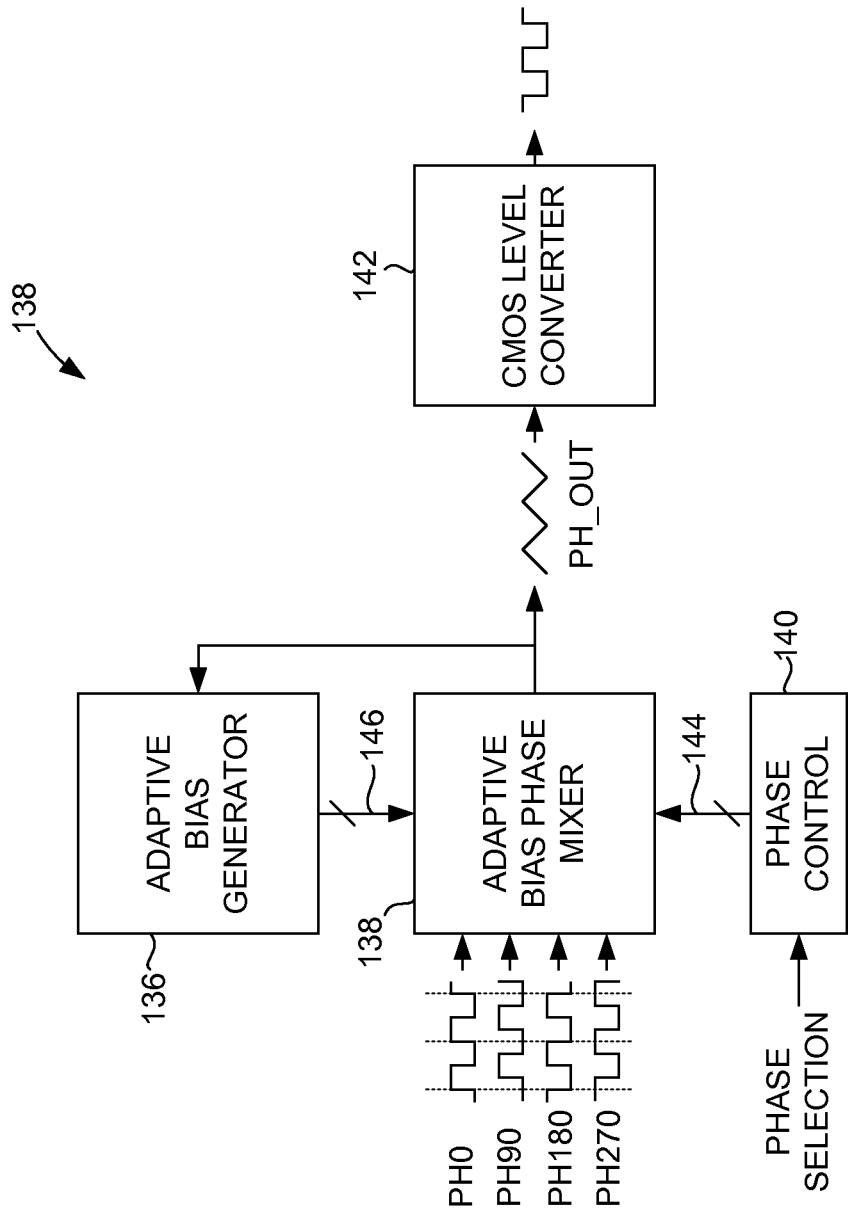
FIG. 8 is a block circuit diagram illustrating another phase interpolator in accordance with another exemplary embodiment of the invention.

As illustrated in FIG. 8, in accordance with another illustrative or exemplary embodiment of the invention, a phase interpolator 134 includes an adaptive bias generator 136, an adaptively biased phase mixer 138, phase control logic 140, and a logic level converter 142. Adaptively biased phase mixer 138, phase control logic 140 and logic level converter 142 can be identical to adaptively biased phase mixer 80, phase control logic 82 and logic level converter 84 described above with regard to FIG. 5. Phase interpolator 134 is similar to above-described phase interpolator 76 (FIG. 5) in that, in response to four phase input signals PH0, PH90, PH180 and PH270, four control words 144, and an adaptive bias signal 146, adaptively biased phase mixer 138 produces a substantially triangle wave-format output phase signal (PH_OUT) having a phase corresponding to the phase selection signal. However, adaptive bias generator 136 differs from adaptive bias generator 78 (FIG. 5) in that adaptive bias generator 136 produces adaptive bias signal 146 in response to the output phase signal (PH_OUT) in a feedback arrangement. More specifically, adaptive bias generator 136 adjusts or changes adaptive bias signal 146 in inverse relationship to changes in the amplitude of the output phase signal (PH_OUT). Thus, adaptive bias generator 136 adapts to or compensates for variations not only in system clock frequency but also for variations in supply voltage, temperature, and semiconductor fabrication processes that affect the operation of adaptively biased phase mixer 80. In still other embodiments (not shown), an adaptive bias generator can compensate for still other types of mixer operating conditions.

Figure 9:
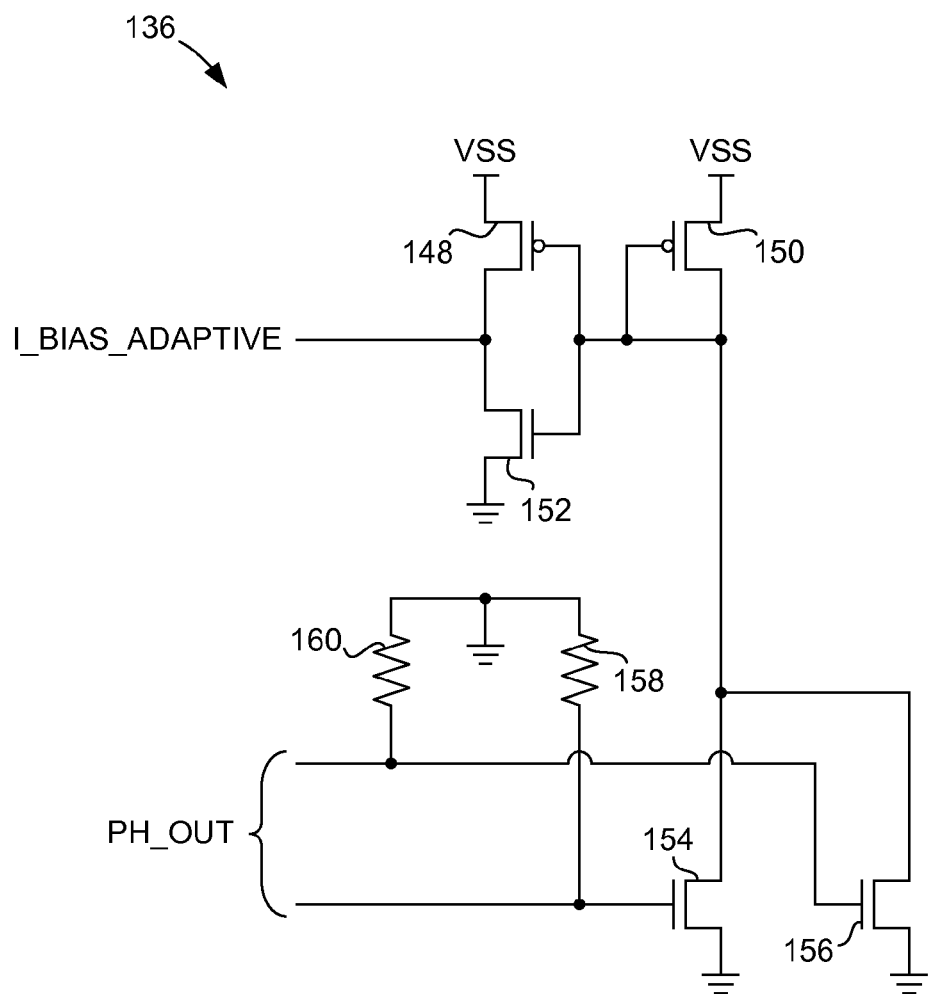
FIG. 9 is a schematic diagram illustrating the adaptive bias generator of the phase interpolator of FIG. 8.

As illustrated in FIG. 9, adaptive bias generator 136 includes a first PFET 148, a second PFET 150, a first NFET 152, a second NFET 154, a third NFET 156, a first resistor 158, and a second resistor 160. The gate terminals of first and second PFETS 148 and 150 and first NFET 152 are connected together and to the drain terminals of second and third NFETs 154 and 156. The source terminals of first and second PFETs are connected to the supply voltage (VSS). The source terminals of second and third NFETs 154 are connected to ground potential. The source terminal of first NFET 152 is also connected to ground potential. The drain terminals of first PFET 148 and first NFET 152 provide adaptive bias signal 146 as an output of adaptive bias generator 136. The positive and negative sides of the (differential) output phase signal (PH_OUT) are provided as an input of adaptive bias generator 136 to the gate terminals of second and third NFETs 154 and 156, respectively. First and second resistors 158 and 160 terminate the gate terminals of second and third NFETs 154 and 156, respectively, to ground potential. In operation, second and third NFETs 154 and 156 sense any voltage swing in the output phase signal (PH_OUT) by translating amplitude into a time-varying current. Second PFET 150 functions as a diode to generate the same current by adjusting the voltage level at its drain terminal. First PFET 148 and first NFET 152 function as an inverter and provide gain.

Including adaptive bias generator 136 in phase interpolator 134 in the manner shown in FIGS. 8-9 compensates for imperfections in the phase input signals PH0, PH90, PH180 and PH270 and in the states of phase control logic 140, in addition to the above-referenced mixer operating conditions.

One or more illustrative embodiments of the invention have been described above. However, it is to be understood that the invention is defined by the appended claims and is not limited to the specific embodiments described. For example, although in the above-described embodiment the exemplary phase interpolator operates upon single-ended signals, in other embodiments a phase interpolator can operate upon differential signals.

What is claimed is:

1. A phase interpolator, comprising:
an adaptively biased phase mixer having mixing transistor circuitry configured to provide an output phase signal corresponding to a selected phase in response to a plurality of phase control signals, a bias current, and a plurality of phase input signals offset in phase from one another, the adaptively biased phase mixer further having adjustable bias transistor circuitry configured to adjust the bias current provided to the mixing transistor circuitry in response to an adaptive bias signal, the adaptively biased phase mixer comprising a plurality of buffer circuits, each buffer circuit receiving one of the plurality of phase input signals and the adaptive bias signal, each buffer circuit comprising a plurality of mixing transistors of the mixing transistor circuitry and a plurality of bias transistors of the adjustable bias transistor circuitry, the plurality of mixing transistors comprising a first group of mixing transistors connected in series with each other, the plurality of bias transistors comprising a first group of bias transistors connected in series with each other, the first group of mixing transistors connected in series with the first group of bias transistors;
phase control circuitry providing the plurality of phase control signals to the adaptively biased phase mixer in response to a phase selection signal corresponding to the selected phase; and
an adaptive bias generator configured to generate the adaptive bias signal in response to at least one mixer operating condition and to provide the adaptive bias signal directly to the adjustable bias transistor circuitry of the phase mixer.

2. The phase interpolator of claim 1, wherein:
the first group of mixing transistors in series with the first group of bias transistors defines a first transistor group; and
the first transistor group is connected between a supply voltage and a ground potential.

3. The phase interpolator of claim 2, wherein:
the first group of bias transistors comprises a first bias P-channel metal-oxide semiconductor field-effect transistor (PFET) and a first bias N-channel metal-oxide semiconductor field-effect transistor (NFET); and
a gate terminal of the first bias PFET and a gate terminal of the first bias NFET respectively receive complementary-polarity portions of the adaptive bias signal.

4. The phase interpolator of claim 3, wherein:
the first group of mixing transistors comprises a first mixing PFET, a first mixing NFET, a first control PFET, and a first control NFET;
a gate terminal of the first mixing PFET and a gate terminal of the first mixing NFET receive one of the plurality of phase input signals; and
a gate terminal of the first control PFET and a gate terminal of the first control NFET respectively receive complementary-polarity portions of a first one of the plurality of phase control signals.

5. The phase interpolator of claim 4, wherein:
the plurality of mixing transistors further comprises a second group of mixing transistors connected in series with each other;
the plurality of bias transistors further comprises a second group of bias transistors connected in series with each other, and the second group of mixing transistors is connected in series with the second group of bias transistors;
the second group of mixing transistors in series with the second group of bias transistors defines a second transistor group, and the second transistor group is connected between the supply voltage and the ground potential, the second group of mixing transistors comprises a second mixing PFET, a second mixing NFET, a second control PFET, and a second control NFET, and a gate terminal of the second mixing PFET and a gate terminal of the second mixing NFET receive the one of the plurality of phase input signals, and a gate terminal of the second control PFET and a gate terminal of the second control NFET respectively receive complementary-polarity portions of a second one of the plurality of phase control signals; and
the second group of bias transistors comprises a second bias P-channel metal-oxide semiconductor field-effect transistor (PFET) and a second bias N-channel metal-oxide semiconductor field-effect transistor (NFET), and a gate terminal of the second bias PFET and a gate terminal of the second bias NFET respectively receive complementary-polarity portions of the adaptive bias signal.

6. The phase interpolator of claim 1, wherein the adaptive bias generator is configured to generate the adaptive bias signal in response to a frequency of a system clock signal.

7. The phase interpolator of claim 1, wherein the adaptive bias generator is configured to generate the adaptive bias signal in response to the output phase signal.

8. A method of operation in a phase interpolator, the phase interpolator comprising an adaptively biased phase mixer, phase control circuitry, and an adaptive bias generator, the method comprising:
providing a system clock signal having a selected frequency;
providing a plurality of phase input signals offset in phase from one another and having the selected frequency;

the phase control circuitry receiving a phase selection signal representing a selected phase and generating a plurality of phase control signals corresponding to the selected phase;

the adaptive bias generator generating an adaptive bias signal in response to at least one mixer operating condition;

each of a plurality of buffer circuits of the adaptively biased phase mixer receiving one of the plurality of phase input signals and the adaptive bias signal, each buffer circuit comprising a plurality of mixing transistors defining mixing transistor circuitry and a plurality of bias transistors defining adjustable bias transistor circuitry, the plurality of mixing transistors comprising a first group of mixing transistors connected in series with each other, the plurality of bias transistors comprising a first group of bias transistors connected in series with each other, the first group of mixing transistors connected in series with the first group of bias transistors;

the adjustable bias transistor circuitry directly receiving the adaptive bias signal from the adaptive bias generator and adjusting a bias current in response to the adaptive bias signal; and the mixing transistor circuitry generating an output phase signal having the selected phase in response to the bias current, the plurality of phase control signals, and the phase input signals.

9. The method of claim 8, wherein:

the first group of mixing transistors in series with the first group of bias transistors defines a first transistor group; and the first transistor group is connected between a supply voltage and a ground potential.

10. The method of claim 9, wherein:

the first group of bias transistors comprises a first bias P-channel metal-oxide semiconductor field-effect transistor (PFET) and a first bias N-channel metal-oxide semiconductor field-effect transistor (NFET); and a gate terminal of the first bias PFET and a gate terminal of the first bias NFET respectively receive complementary-polarity portions of the adaptive bias signal.

11. The method of claim 10, wherein:

the first group of mixing transistors comprises a first mixing PFET, a first mixing NFET, a first control PFET, and a first control NFET;

a gate terminal of the first mixing PFET and a gate terminal of the first mixing NFET receive one of the plurality of phase input signals; and a gate terminal of the first control PFET and a gate terminal of the first control NFET respectively receive complementary-polarity portions of a first one of the plurality of phase control signals.

12. The method of claim 11, wherein:

the plurality of mixing transistors further comprises a second group of mixing transistors connected in series with each other;

the plurality of bias transistors further comprises a second group of bias transistors connected in series with each other, and the second group of mixing transistors is connected in series with the second group of bias transistors;

the second group of mixing transistors in series with the second group of bias transistors defines a second transistor group, and the second transistor group is connected between the supply voltage and the ground potential, the second group of mixing transistors comprises a second mixing PFET, a second mixing NFET, a second control PFET, and a second control NFET, a gate terminal of the second mixing PFET and a gate terminal of the second mixing NFET receive the one of the plurality of phase input signals, and a gate terminal of the second control PFET and a gate terminal of the second control NFET respectively receive complementary-polarity portions of a second one of the plurality of phase control signals; and the second group of bias transistors comprises a second bias P-channel metal-oxide semiconductor field-effect transistor (PFET) and a second bias N-channel metal-oxide semiconductor field-effect transistor (NFET), and a gate terminal of the second bias PFET and a gate terminal of the second bias NFET respectively receive complementary-polarity portions of the adaptive bias signal.

13. The method of claim 8, wherein the adaptive bias generator generates the adaptive bias signal in response to a frequency of a system clock signal.

14. The method of claim 8, wherein the adaptive bias generator generates the adaptive bias signal in response to the output phase signal.

* * * * *